(12) United States Patent
Koike

(10) Patent No.: US 6,989,577 B2
(45) Date of Patent: Jan. 24, 2006

(54) SEMICONDUCTOR DEVICE HAVING MULTIPLE INSULATION LAYERS

(75) Inventor: Hidetoshi Koike, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 27 days.

(21) Appl. No.: 09/953,345

(22) Filed: Sep. 13, 2001

(65) Prior Publication Data

US 2002/0079552 A1 Jun. 27, 2002

(30) Foreign Application Priority Data

Sep. 14, 2000 (JP) ........................................ 2000-279591

(51) Int. Cl.
*H01L 29/00* (2006.01)

(52) U.S. Cl. ...................... 257/529; 257/530; 257/665
(58) Field of Classification Search ................. 257/173, 257/209, 529, 530, 665; 438/132, 215, 281, 438/333, 467
See application file for complete search history.

(56) References Cited

U.S. PATENT DOCUMENTS 6,046,488 A * 4/2000 Kawasaki et al. .......... 257/529

6,372,554 B1 * 4/2002 Kawakita et al. ........... 438/132

FOREIGN PATENT DOCUMENTS

| JP | 05-218205 | 8/1993 |
|----|-----------|--------|
| JP | 07-037988 | 2/1995 |
| JP | 11-111847 | 4/1999 |
| JP | 2000-332114 | 11/2000 |

OTHER PUBLICATIONS

U.S. Appl. No. 09/604,791 filed Jun. 28, 2000.
U.S. Appl. No. 09/411,590 filed Oct. 4, 1999.

* cited by examiner

*Primary Examiner*—Thien F Tran
(74) *Attorney, Agent, or Firm*—Hogan & Hartson, LLP

(57) ABSTRACT

A semiconductor device includes a multiple insulation layer structure in which multiple insulation layers each having interconnection layer are built up and either one of the interconnection layer forming a fuse is blown in order to select a spare cell to relieve a defective cell; and an opening area corresponding to said fuse, the opening being formed on one or more insulation layers disposed above the layer which includes the fuse, wherein a side wall position corresponding to the opening of the first protective insulation film formed on the top layer of the multiple layers and a side wall position corresponding to the opening of the second protective insulation film formed on the first protective insulation film are continuous at the boundary thereof.

7 Claims, 7 Drawing Sheets

SEMICONDUCTOR DEVICE HAVING MULTIPLE INSULATION LAYERS

CROSS REFERENCE TO RELATED APPLICATION

This application is based upon and claims the benefit of priority from the prior Japanese Patent Applications No. 2000-279591, filed on Sep. 14, 2000; the entire contents of which are incorporated herein by reference.

BACKGROUND OF THE INVENTION

The present invention relates to a semiconductor device and its manufacturing method, especially to a semiconductor device having a circuit to relieve a defect using copper interconnection and a method for manufacturing the device.

In semiconductor devices, copper (Cu) interconnection is widely adopted in order to reduce signal delay in interconnections by lowering resistance in interconnections and to increase electromigration resistance. Especially copper interconnections are becoming a mainstream in high performance logic large-scale integration (LSI).

On the other hand, in LSIs having memories in a mixed manner, the adoption of redundant construction having a built-in defect relieving circuit in order to increase process yield is common technology. In the redundancy construction, a spare cell is used by replacing a defective cell found.

The metal fuse usually employs a metal interconnection layer which is one layer below the top metal interconnection layer. This is because the top layer is not well protected and not reliable because the metal is degraded by contact with the atmosphere, etc., and the top layer is not suited to be blown since the film thickness of the metal interconnection layer on the top layer is large because it is often used as a power line.

Accordingly, in order to blow a metal fuse, it is necessary to remove the first protective insulating film such as the interlayer insulating film and passivation film which exist above the metal fuse which are an obstacle for blowing a fuse. This process of removing an interlayer film and the first protective insulating film on a metal fuse is called the "fuse window opening process".

The conventional window opening process will be explained below.

FIGS. 14 and 15 are cross sectional views of the device showing the conventional window opening process.

FIG. 14 is a sectional view of a conventional semiconductor device with a four-layer interconnection structure. This four-layer interconnection structure includes the first and second interlayer insulating film 16 and 19, the first interconnection layer 21, a silicon nitride film as an antioxidant film ($Si_3N_4$ film) 22, the third interlayer insulating film 23, the second interconnection layer 27, a silicon nitride film ($Si_3N_4$ film) 28, the fourth interlayer insulating film 29, the third interconnection layer 32, a silicon nitride film ($Si_3N_4$ film) 33, the fifth interlayer insulating film 34, the fourth interconnection layer 37, silicon nitride film ($Si_3N_4$ film) 38, etc. which are built up on the semiconductor substrate 11 where devices are formed. A bonding pad section 41 and a passivation film 39 are formed on the top layer.

Such semiconductor devices are manufactured by the following process.

At first, in order to form a fuse window opening, photoresist 100 is applied to the entire part then patterning is performed by photolithography so that the area except a fuse window opening is covered with the photoresist 100. A passivation film 39, a thin silicon nitride film 38 and the fifth interlayer insulating film 34 are etched in a method such as RIE (Reactive Ton Etching) using the resist 100 as an etching mask in order to open a fuse window 110. In this state, the positions of a side wall 101 of the resist 100 at the opening 110, a side wall 102 of the passivation film 39, a side wall 103 of the thin silicon nitride film 38 and a side wall 104 of the fifth interlayer insulating film 34 are continuous.

Finally, the resist 100 is removed and a polyimide film 120 as a surface protective film is formed on the passivation film 39 except a bonding pad section 41 and the fuse window 110. At this time, the positions of a side wall 121 of a polyimide film 120 and a side wall 102 of the passivation film 39 are not matched. This creates a probelam that the fuse window a opening becomes narrower as explained later.

SUMMARY OF THE INVENTION

A semiconductor device according to an embodiment of the present invention includes:

a multiple insulation layer structure in which multiple insulation layers each having interconnection layer are built up and either one of the interconnection layer forming a fuse is blown in order to select a spare cell to relieve a defective cell; and an opening area corresponding to said fuse, said opening being formed on one or more insulation layers disposed above the layer which includes said fuse, wherein a side wall position corresponding to said opening of the first protective insulation film formed on the top layer of said multiple layers and a side wall position corresponding to said opening of the second protective insulation film formed on said first protective insulation film arc continuous at the boundary thereof.

A method of manufacturing a semiconductor device according to an embodiment of the present invention includes:

forming elements on a substrate;

forming stacked interconnection structure on said elements by sequentially forming interlayer insulating film, interconnection layer and antioxidant layer and repeating these forming at least two times;

forming a first protective insulating film on a top antioxidant layer;

removing said first protective insulating film and said top antioxidant layer at lead out region of a top interconnection layer to form a lead out opening;

forming a lead out electrode in said lead out opening;

forming a second protective insulating film having an opening on said first protective insulating film, said opening corresponding to a fuse portion in an interconnection layer below said top interconnection layer; and forming a window for fuse blowing by removing a part of said first protective insulating film, said top antioxidant layer and said interlayer insulating film using said second protective insulating film as a mask.

A method for manufacturing a semiconductor device according to another embodiment of the present invention includes forming elements on a substrate;

forming stacked interconnection structure on said elements by sequentially forming interlayer insulating film, interconnection layer and antioxidant layer and repeating these forming at least two times;

forming a first protective insulating film on a top antioxidant layer;

removing said first protective insulating film and said top antioxidant layer at lead out region of a top interconnection region and fuse blowing region of a top interconnection layer to form a interconnection lead out opening and a fuse blowing opening;

forming a lead out electrode in said lead out opening;

forming a second protective insulating film having an opening on said first protective insulating film, said opening corresponding to a said fuse blowing opening; and forming a window for fuse blowing by removing a part of said interlayer insulating film using said second protective insulating film as a mask.

BRIEF DESCRIPTION OF THE DRAWINGS

In the attached drawings.

DETAILED DESCRIPTION OF THE INVENTION

A semiconductor device and a method for manufacturing the semiconductor device according to the present invention will now be explained in detail referring to drawings. The examples which are explained herein are the embodiments adopted for LSI having four-layer Cu interconnection.

FIGS. 1 to 9 are cross section diagrams of process steps showing a manufacturing method of a semiconductor device according to the first embodiment of the present invention.

Figure 1:
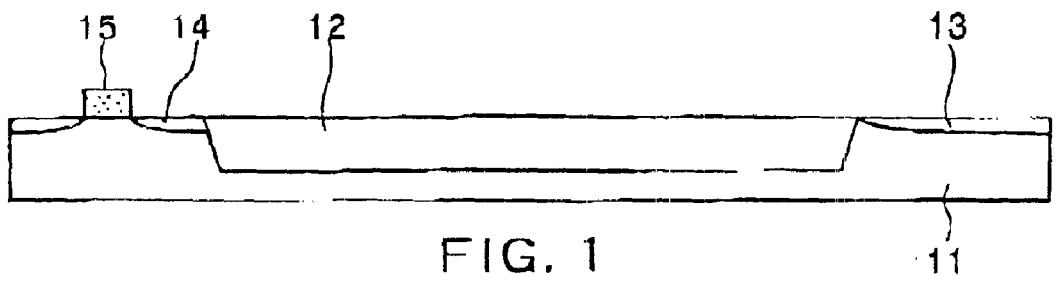
FIG. 1 is a cross section diagram showing a first step of a method of manufacturing semiconductor device according to a first embodiment of the present invention.

As shown in FIG. 1, a device isolation area 12 is formed in a surface part of a silicon substrate 11 using the ordinal Shallow Trench Isolation (STI) technology. Then, a diffusion region 13 which is a passive device such as a capacitor and an active element such as a MOSFET having a source and drain diffusion regions 14 and a gate 15 is formed in a device area which is surrounded by the device isolation region.

Figure 2:
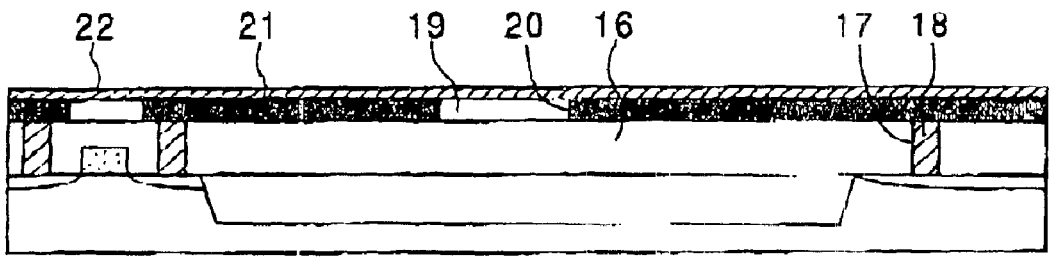
FIG. 2 is a cross section diagram showing a second step of a method of manufacturing semiconductor device according to the first embodiment of the present invention.

Then as shown in FIG. 2, the first interlayer insulating film 16 such as BPSG film is deposited on the entire surface and the surface is flattened using the Chemical Mechanical Polishing (CMP) method. After that, a first contact hole 17 is opened using the photolithography method and a contact 18 is formed by filling the contact hole 17 with tungsten. Thereafter, a second interlayer insulating film 19 such as $SiO_2$ film is deposited on the whole surface of them shown above. The first interconnection forming area is removed by the photolithography method and a first interconnection trench 20 is formed in the second layer insulating film. Subsequently, copper is deposited on the entire surface and it is flattened by the CMP method to make a first interconnection layer 21 remain in the first interconnection trench 20. At this moment, a thin silicon nitride film 22 is deposited on the entire surface in order to prevent oxidation and diffusion as copper is liable to be oxidized. The process described above is called "single damascene process" of copper interconnection.

Figure 3:
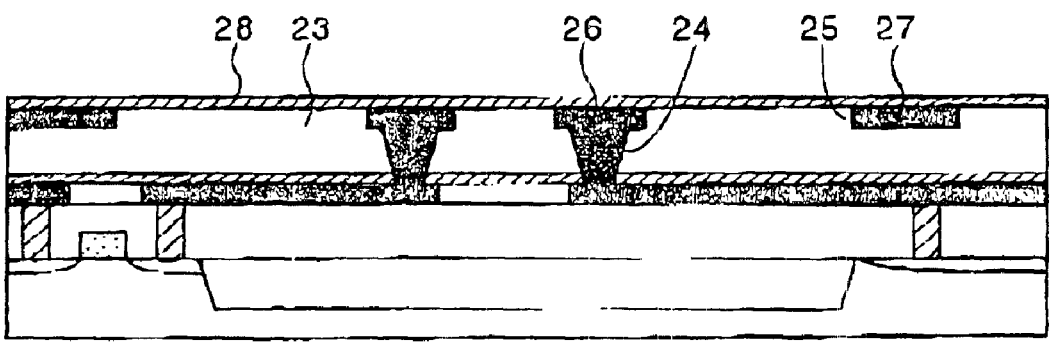
FIG. 3 is a cross section diagram showing a third step of a method of manufacturing semiconductor device according to the first embodiment of the present invention.

As shown in FIG. 3, a third interlayer insulating film 23 such as $SiO_2$ film is deposited on the whole surface and a second contact hole 24 is opened with photolithography method in order to connect it to the first interconnection layer 21. Subsequently, the second interconnection forming region of the third interlayer insulating film 23 is removed to form a second interconnection trench 25 using the photolithography method. Then, copper is deposited on the entire surface and is flattened by the CMP method to make a second contact 26 in the second contact hole 24 and an interconnection layer 27 remains in the second interconnection trench 25, respectively. Then, as in the case of the first layer, a thin silicon nitride film ($Si_3N_4$ film, the same hereinafter) 28 is deposited on the entire surface in order to prevent oxidation and diffusion of the copper. The process shown described is called "dual damascene process" of copper interconnection.

Figure 4:
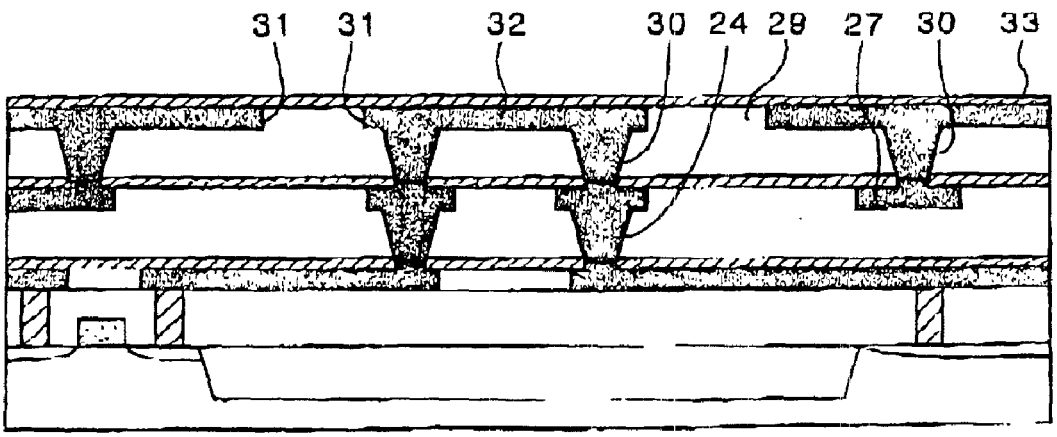
FIG. 4 is a cross section diagram showing a 4th step of a method of manufacturing semiconductor device according to the first embodiment of the present invention.

As shown in FIG. 4, a fourth interlayer insulating film 29 such as $SiO_2$ film is deposited on the entire surface and the third contact hole 30 is opened using the photolithography method in order to connect it to the second contact hole 24 and the second contact 26. Subsequently, the third interconnection forming region on the fourth interlayer insulating film 29 is removed to form a third interconnection trench 31 using the photolithography method. Then, copper is deposited on the entire surface and is flattened by the CMP method to make a third interconnection layer 32 that remains in the third contact hole 30 and the third interconnection trench 31. Then, as in the case of the other layers, a thin silicon nitride film 33 is deposited on the entire surface in order to prevent oxidation and diffusion of copper. In the case of a copper interconnection with the four-layer structure, a metal fuse is formed as a third interconnection layer 32 which connects two contact holes in the center of FIG. 4.

Figure 5:
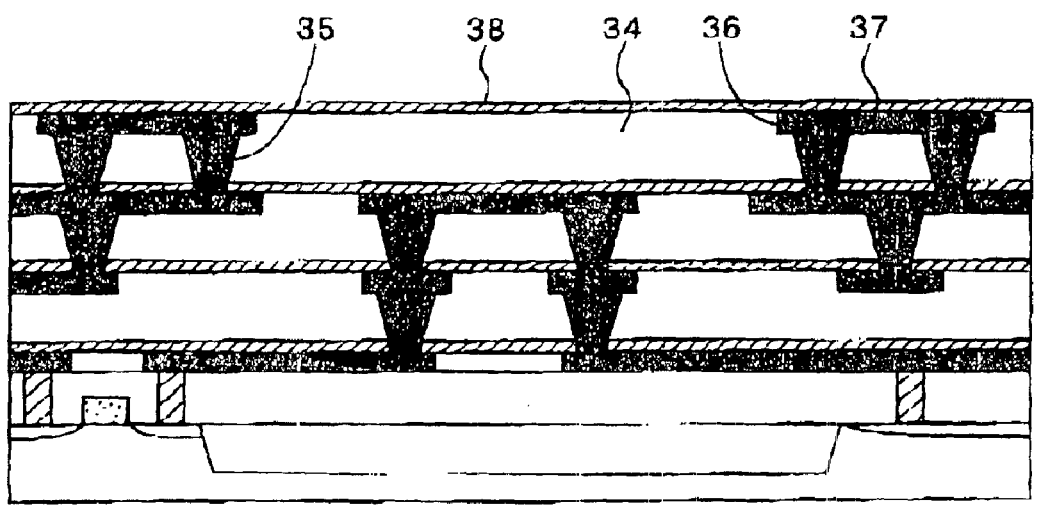
FIG. 5 is a cross section diagram showing a 5th step of a method of manufacturing semiconductor device according to the first embodiment of the present invention.

Then, as shown in FIG. 5, a fifth interlayer insulating film 34 such as $SiC_2$ film is deposited and a fourth contact hole 35 is opened using the photolithography method. Subsequently, the fourth interconnection trench 36 is patterned into the specified configuration using the photolithography method. After that, copper is deposited on the entire surface and is flattened using the CMP method to make a fourth interconnection layer 37 that remains in the fourth contact hole 35 and in the fourth interconnection trench 36. Then, as in the case of the other layers, a thin silicon nitride film 38 is deposited in order to prevent oxidation and diffusion of copper.

Figure 6:
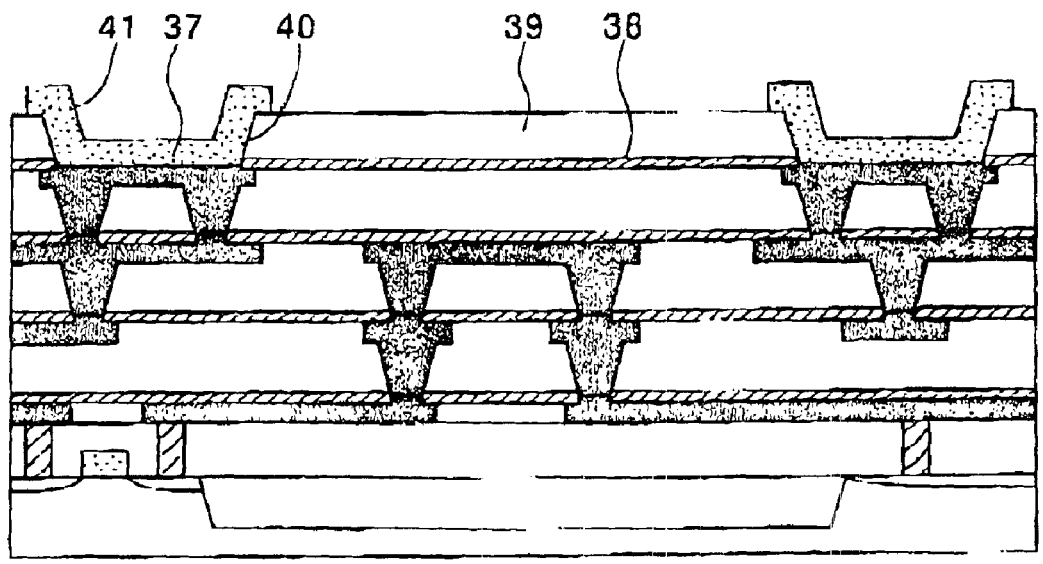
FIG. 6 is a cross section diagram showing a 6th step of a method of manufacturing semiconductor device according to the first embodiment of the present invention.

The, as shown in FIG. 6, a passivation film 39 such as a Phosphorus Silicate Glass (PSG) film is deposited and an opening is formed by etching the passivation film 39 and a thin silicon nitride film 38 on the fourth interconnection layer 37 to be a bonding pad to remove them and form an opening 40 to expose the fourth interconnection layer 37. A bonding pad 41 is formed at the opening 40 by depositing aluminum on the entire surface and performing a patterning into the specified configuration with photolithography method.

The fuse window opening process according to the present invention applied to the LSI with four layer copper interconnection as shown above will now be explained referring to FIGS. 7 to 9.

Figure 7:
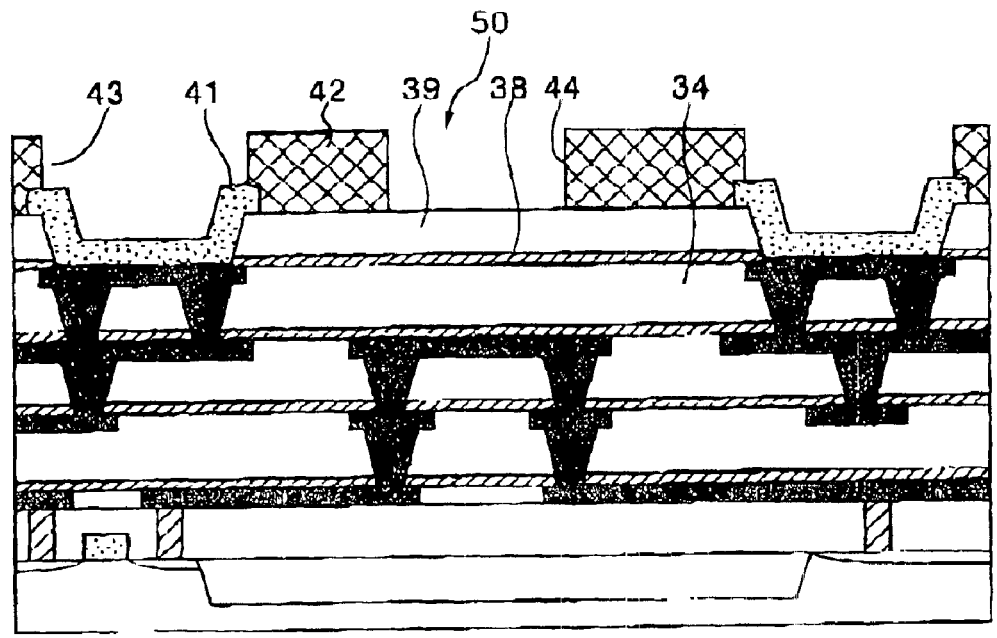
FIG. 7 is a cross section diagram showing a 7th step of a method of manufacturing semiconductor device according to the first embodiment of the present invention.

As shown in FIG. 7, polyimide resin film 42 is selectively formed to protect the surface. Openings 43 and 44 of the polyimide resin film 42 are formed on a part of the bonding pad 41 and fuse window opening 50, respectively. This shape of pollyimide resin film 42 is obtained by a method where lithography is performed by application of a spin coating method, a method where exposure is performed by applying photosensitive polyimide or a method where a screen printing is performed.

Figure 8:
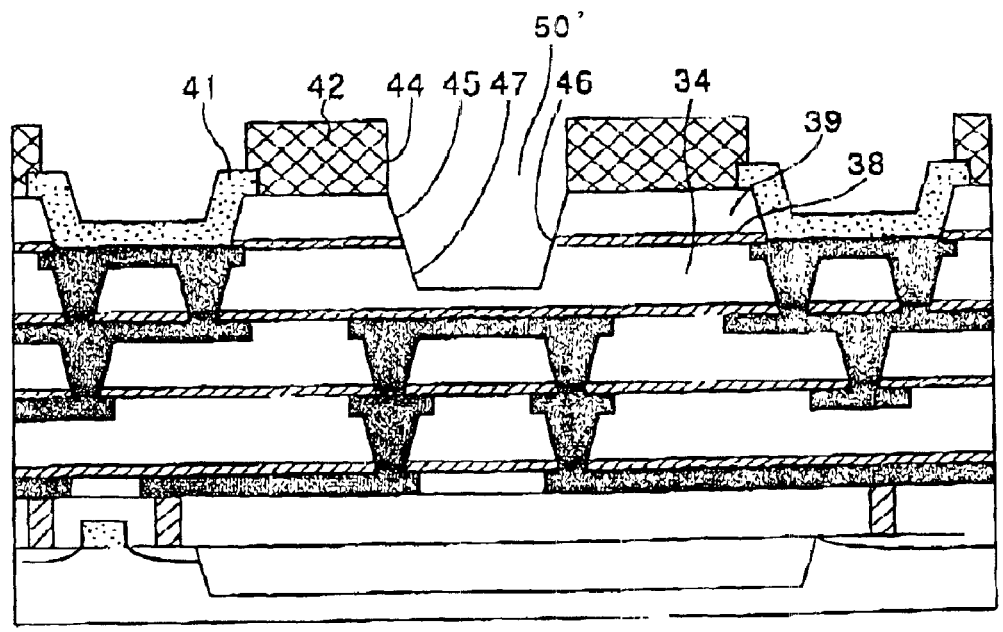
FIG. 8 is a cross section diagram showing a 8th step of a method of manufacturing semiconductor device according to the first embodiment of the present invention

Then, as shown in FIG. 8, the passivation film 39, the thin silicon nitride film 38 and the fifth interlayer insulating film 34 are removed to form a window opening 50 by performing anisotropic etching such as RIE using the polyimide resin film 42 as a mask. Their side walls 45, 46, 47 have no gaps and are continuous with the opening side wall 44 of the polyimide resin film 42.

In the process to open the window according to an embodiment of the prevent invention, the passivation film 39, the thin silicon nitride film 38 and the fifth interlayer insulating film 34 are etched simultaneously using the polyimide resin film 42 as a mask. Therefore, it is not required to add one time of photo lithography step to open a window for metal fusing in addition to opening a bonding pad as the conventional art. Thus, the process is simplified and the cost is reduced.

Figure 9:
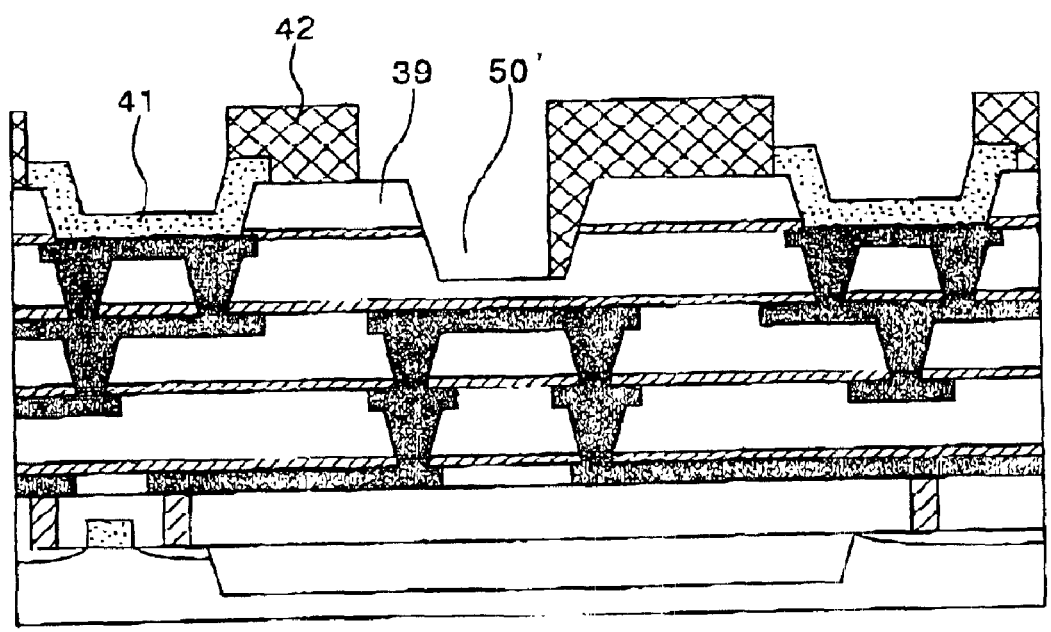
FIG. 9 is a cross section diagram to explain a defect which does not occur with the method of manufacturing semiconductor device according to embodiments of the present invention.

Also according to an embodiment of the present invention, when performing a process to open a fuse window, a polyimide resin film to protect the surface is also used as a mask. If a window opening is formed in a separate process and a protective film of polyimide is formed after that, there may occur a problem that the polyimide resin film 42 protrudes into the window opening 50 due to the misalignment of the polyimide resin film 42 as shown in FIG. 9 and the window opening 50 becomes narrower. The problem can be solved by the present invention.

Further, the polyimide resin film releases the stress generated in the layer below to prevent generation of varied defects effectively.

FIGS. 10 to 13 are cross section diagrams showing a manufacturing method of a semiconductor device according to a second embodiment of the present invention.

Figure 10:
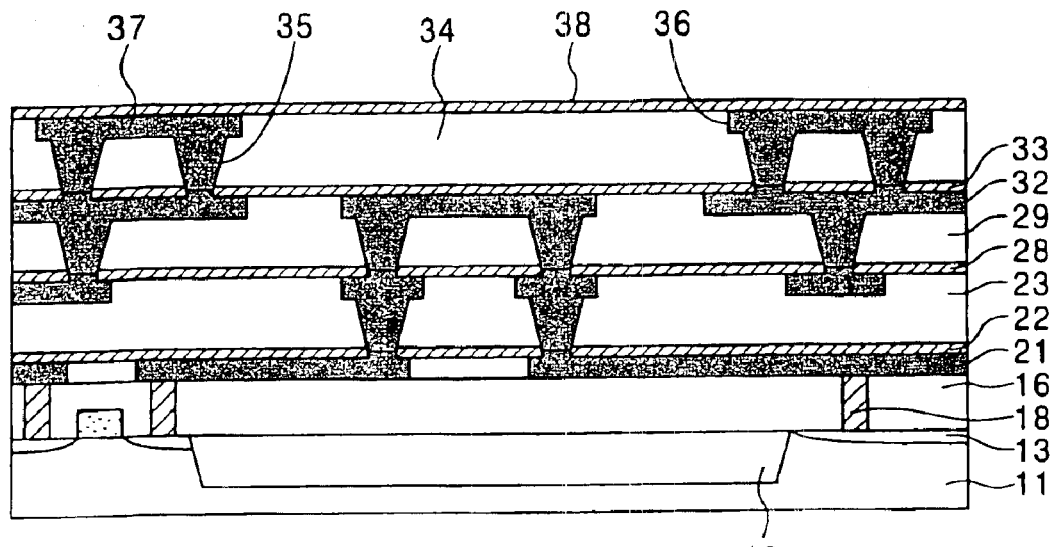
FIG. 10 is a cross section diagram showing a first step to open a fuse window according to the second embodiment of the present invention.

FIG. 10 is exactly the same as FIG. 6 according to the first embodiment of the invention. In the following description, common reference numbers are used for the same elements between them.

Figure 11:
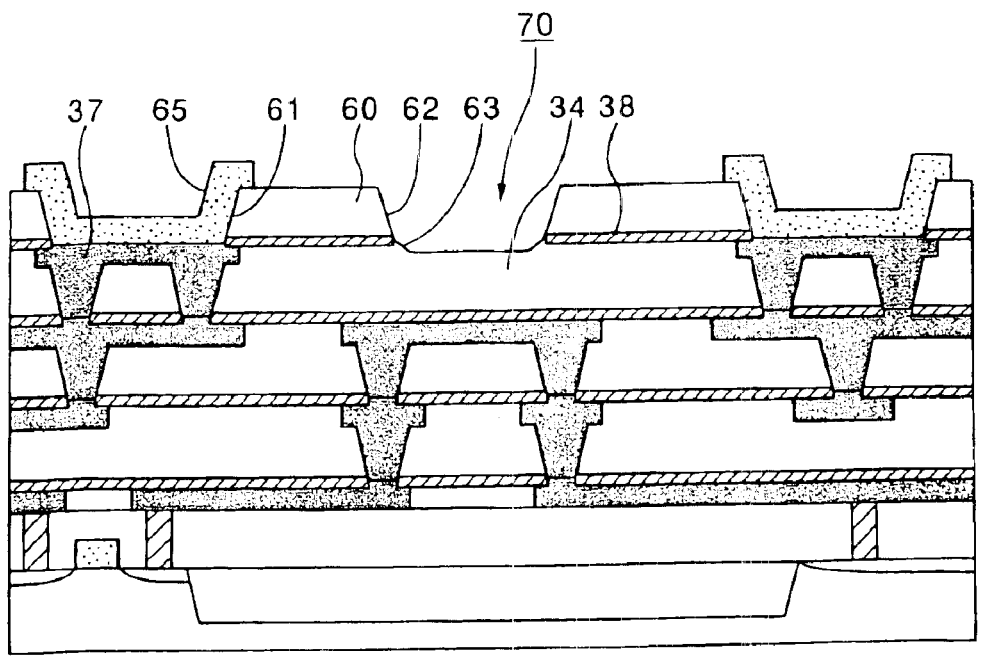
FIG. 11 is a cross section diagram showing a second step to open a fuse window according to the second embodiment of the present invention.

As shown in FIG. 11, a passivation film 60 such as PSG film is deposited and the passivation film on the fourth interconnection layer 37 to be a bonding pad and the passivation film at the fuse window opening 70 are etched with the photolithography method to form openings 61 and 62 respectively. At this time, the thin silicon nitride film 38 is also etched at the area, the fourth copper interconnection 37 is exposed at the bonding pad forming area and the a part 63 of the surface of the fifth interlayer insulating film 34 is etched at the fuse window opening.

After that, a bonding pad 65 is formed by depositing aluminum and reserving it in the specified shape at the bonding pad forming area with photo lithography method.

Figure 12:
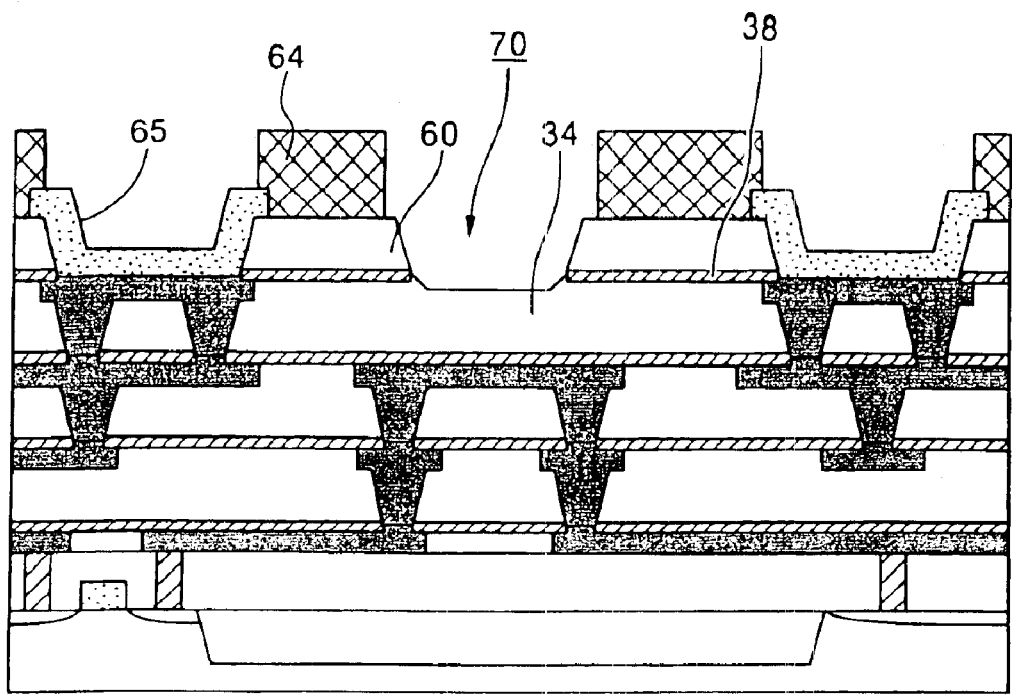
FIG. 12 is a cross section diagram showing a third step to open a fuse window according to the second embodiment of the present invention.

Then, as shown in FIG. 12, a polyimide resin film 64 is formed to protect the surface. The polyimide resin film 64 is formed selectively on the area except the bonding pad 63 and the fuse window opening 70 by the method shown above.

Figure 13:
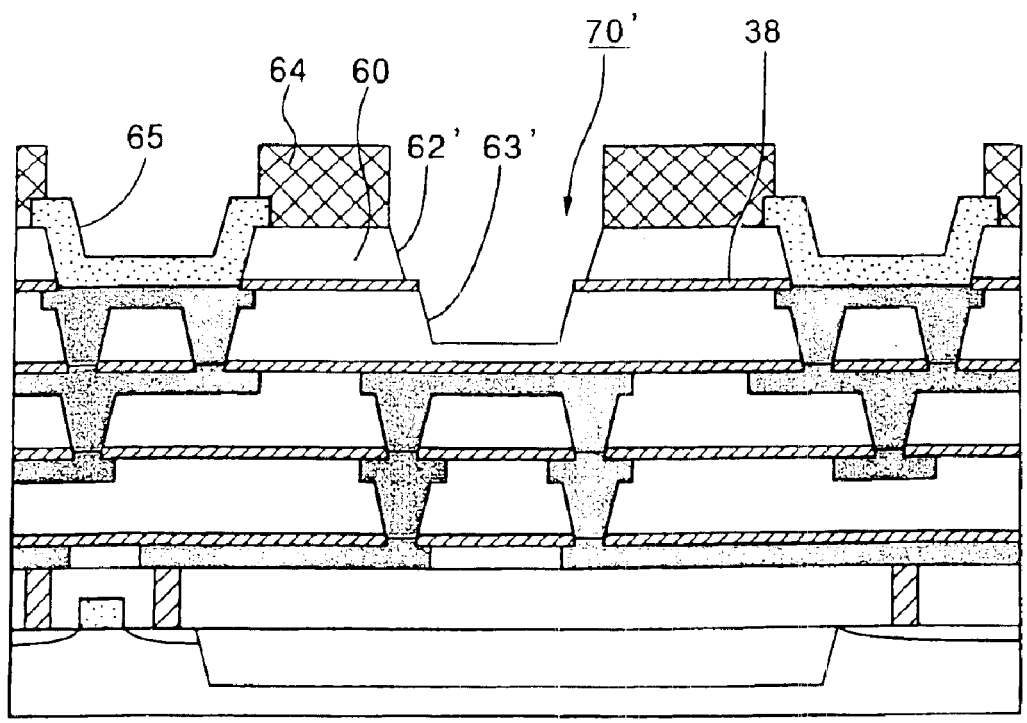
FIG. 13 is a cross section diagram showing a fourth step to open a fuse window according to the second embodiment of the present invention.
Figure 14:
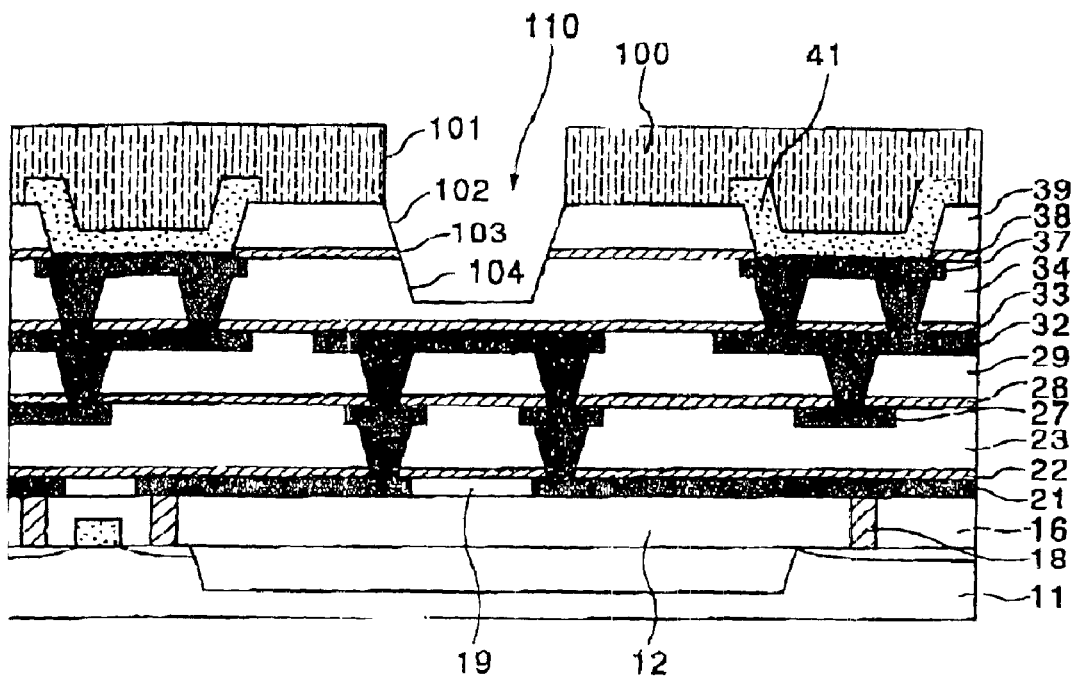
FIG. 14 is a cross section diagram of a device to show a step to open a fuse window in the conventional semiconductor device.
Figure 15:
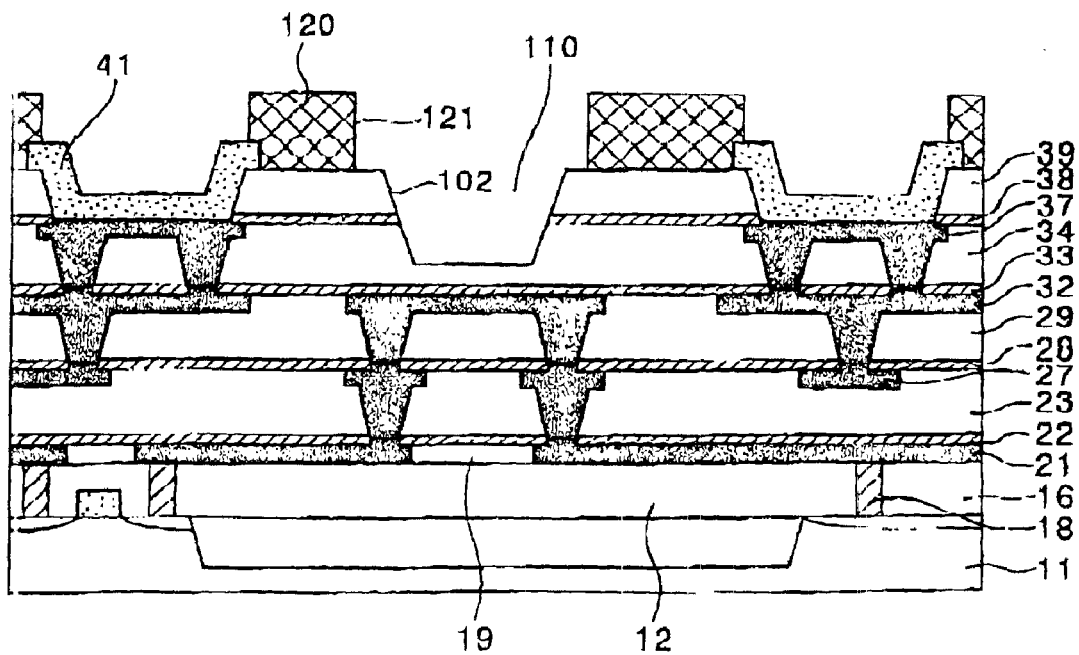
FIG. 15 is a cross section diagram of a device to show a following step process to open a fuse window in the conventional semiconductor device.

Then, as shown in FIG. 13, the fifth interlayer insulating film 34 is etched by a method such as RIE using the polyimide resin film 64 as an etching mask in order to open a fuse window 70. By the etching method, the side wall 62 of the window opening of the passivation film 60 is wider than that of FIG. 11 and the side wall 63 of the fifth interlayer insulating film 33 is also deeper and wider than that of FIG. 11.

In this embodiment, the fuse opening process is performed in such a way that the second protective insulating film is formed on the first protective insulating film in accordance with the opening of the first protective insulating film whose opening is formed in accordance with the fuse opening area in advance. Therefore, it is not required to add a photo lithography step to open a fuse window. Thus, the process is simplified and the cost is reduced. Further, the polyimide resin film modifies the stress generated in the layer positioned below to prevent generation of varied defects effectively.

In the embodiments shown above, a passivation film and a polyimide resin film are used for the first protective insulating film and the second protective insulating film respectively. However, they are only examples, not restrictive. Materials such as PSG, BSG, BPSG SiN can be used as the first protective insulating film if they have protective effect.

Other materials can be used as the second protective insulating film if they have protective and stress releasing effect.

In the semiconductor device according to the embodiments of the present invention, a fuse window opening will not become narrower and fuse blowing is performed stably as there is no gap between side walls of a protective polyimide resin film and a passivation film on a fuse window opening area.

Furthermore, in the first embodiment of manufacturing method of the semiconductor device according to the present invention, the first protective insulating film at an opening of the fuse window, a thin silicon nitride film and an interlayer insulating film Are etched simultaneously using a polyimide resin film as a mask. Therefore, it is not required to add one photo lithography step as another process to open a metal fuse window in addition to perform opening of a bonding pad. Thus, the process is simplified and the cost is reduced.

Still further, in the second embodiment of manufacturing method of the semiconductor device according to the present invention, the first protective insulating film and the thin silicon nitride film at an opening of the fuse window are etched when an opening is made for the boding pad in advance and the interlayer insulating film is etched using a polyimide as a mask. Therefore, it is not required to add one photolithography step to open a metal fuse window in addition to opening a bonding pad. Furthermore, according to this embodiment, depth to be etched is smaller than the first embodiment. Thus, the process is simplified and the cost is reduced.

What is claimed is:

1. A semiconductor device comprising:
   a multiple insulation layer structure in which multiple insulation layers each having interconnection layers are built up and one or another of the interconnection layers forms a fuse that is blown in order to select a spare cell to relieve a defective cell;
   a first protective insulation film provided on said multiple insulation layer structure;
   a second protective insulation film provided on said first protective insulation film; and
   an opening corresponding to said fuse, provided in said multiple insulation layers disposed above the interconnection layer which includes said fuse, in said first protective insulation film and in said second protective insulation film,
   wherein a side wall corresponding to said opening of said first protective insulation film and a side wall corresponding to said opening of said second protective insulation film are continuous at the boundary thereof and the side wall of said first protective insulation film and a side wall corresponding to said opening of the insulation layers are discontinuous at the boundary thereof, and
   wherein a thin insulation film is inserted between said first protective insulation film and said multiple layer insulation structure.

2. The semiconductor device according to claim 1, wherein a diameter of said opening provided in said insulation layers is smaller than that of said opening provided in said first and second protective insulation films.

3. The semiconductor device according to claim 1, wherein said interconnection layer is a copper interconnection layer.

4. The semiconductor device according to claim 1, wherein said first protective insulating film is a passivation film.

5. The semiconductor device according to claim 1, wherein said second protective insulating film is a polyimide resin film.

6. The semiconductor device according to claim 1, wherein said thin insulation film is a silicon nitride film.

7. The semiconductor device according to claim 6, wherein said thin insulation film prevents oxidation and diffusion of the interconnection material.

* * * * *